United States Patent
Coburn et al.

(10) Patent No.: US 6,475,920 B2
(45) Date of Patent: Nov. 5, 2002

(54) PLASMA ETCHING METHOD USING LOW IONIZATION POTENTIAL GAS

(75) Inventors: John W. Coburn, San Jose, CA (US); Kevin G. Donohoe, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 187 days.

(21) Appl. No.: 09/812,543

(22) Filed: Mar. 20, 2001

(65) Prior Publication Data

US 2001/0012694 A1 Aug. 9, 2001

Related U.S. Application Data

(63) Continuation of application No. 09/028,610, filed on Feb. 24, 1998, now Pat. No. 6,228,775.

(51) Int. Cl.$^7$ ............................................... H01L 21/00
(52) U.S. Cl. .................. 438/714; 438/723; 438/743; 438/740
(58) Field of Search .................... 216/67, 79; 252/79.1; 438/714, 723, 734, 743, 740

(56) References Cited

U.S. PATENT DOCUMENTS

| | | |
|---|---|---|
| 4,190,488 A | 2/1980 | Winters |
| 4,298,443 A | 11/1981 | Maydan |
| 4,582,581 A | 4/1986 | Flanigan et al. |
| 4,744,861 A | 5/1988 | Matsunaga et al. |
| 4,749,440 A | 6/1988 | Blackwood et al. |
| 4,786,359 A | 11/1988 | Stark et al. |
| 5,030,319 A | 7/1991 | Nishino et al. |
| 5,213,659 A | 5/1993 | Blalock et al. |
| 5,238,862 A | 8/1993 | Blalock et al. |
| 5,270,264 A | 12/1993 | Andideh et al. |
| 5,300,801 A | 4/1994 | Blalock et al. |
| 5,320,981 A | 6/1994 | Blalock |
| 5,380,401 A | 1/1995 | Jones et al. |
| 5,384,009 A | 1/1995 | Mak et al. |
| 5,503,901 A | 4/1996 | Sakai et al. |
| 6,228,775 B1 * | 5/2001 | Coburn et al. ............... 438/714 |

OTHER PUBLICATIONS

Beulens, J. J., et al., "Fast silicon etching using an expanding cascade arc plasma in a $SF_6$/argon mixture," *J. Vac. Sci. Technol. B, 10*(6), 2387–2392 (1992).

Chakrabarti, U.K. et al., "Dry Etching of III–V semiconductors in $CH_3I$, $C_2H_5I$, and $C_3H_7I$ discharges," *J. Vac. Sci. Technol. B., 10*(6), 2378–2386 (1992).

Connor, W.T., et al., "Concentration profiles of CF in a $CF_4$ radio frequency discharge via laser induced fluorescence and actionometry," *Appl. Phys. Lett., 60*(5), 557–559 (1992).

Driscoll, D.C., et al., "Direct Current plasma discharges of fluorobromomethanes," *J. Vac Sci. Technol. A., 10*(3), 444–449 (1992).

Hirobe, K., et al., "Some Problems in Plasma Etching of Al and Al–Si Alloy Films," *J. Electrochem. Soc., 128*, 2686–2688 (1981).

Hu, E. L., et al., "Reactive ion etching of GaAs in a chlorine plasma," *J. Vac. Sci. Technol. B., 2*(1), 85–88 (1984).

Hur, K.Y., et al. "Fabrication of overpass microstructures in GaAs using isotropic reactive ion etching," *J. Vac. Sci. Technol. B., 10*(6), 2486–2487 (1992).

(List continued on next page.)

Primary Examiner—William A. Powell
(74) Attorney, Agent, or Firm—Mueting, Raasch & Gebhardt, P.A.

(57) ABSTRACT

An etching method for forming an opening includes providing a substrate assembly having a surface and an oxide layer thereon. A patterned mask layer is provided over the oxide layer exposing a portion of the oxide layer. A plasma including one or more of $C_xH_yF_z^+$ ions and $C_xF_z^+$ ions and further including xenon or krypton ions is used to etch the oxide layer at the exposed portion to define the opening in the oxide layer while simultaneously depositing a polymeric residue on a surface defining the opening. The etching is continued until the opening in the oxide layer is selectively etched to the surface of the substrate assembly.

36 Claims, 4 Drawing Sheets

OTHER PUBLICATIONS

Ikegami, N., et al., "Mechanisms of Surface Reaction in Fluorocarbon Dry Etching of Silicon Dioxide—An Effect of Thermal Excitation," *Jpn. J. Appl. Phys., 31,* 2020–2024 (1992).

Kazumi, H., et al., "Model prediction of radial composition of $C_4F_8$ plasmas and correlation with measured etch characteristics of silicon dioxide," *Plasma Sources Sci. Technol., 5,* 200–209 (1996).

Koretsky, M. D., et al. "A simple model for the etchiong of photoresist with plasma–generated reactants," *J. Appl. Phys., 72*(11), 5081–5088 (1992).

Lothian, J. R., et al. "Wet and dry etching characteristics of $Al_{0.5}In_{0.5}P$," *J. Vac. Sci. Technol. B., 10*(3), 1061–1062 (1992).

Sato, M., et al., "Suppresion of Microloading Effect by Low–Temperature $SiO_2$ Etching," *Jpn. J. Appl. Phys., 31,* 4370–4375 (1992).

* cited by examiner

PLASMA ETCHING METHOD USING LOW IONIZATION POTENTIAL GAS

This is a continuation of application Ser. No. 09/028,610, filed Feb. 24, 1998, now U.S. Pat. No. 6,228,775 (pending), which is incorporated herein by reference.

FIELD OF THE INVENTION

The present invention relates to semiconductor fabrication methods. More particularly, the present invention relates to oxide etching methods using a plasma generated from a fluorine and carbon containing gas and a low ionization potential gas.

BACKGROUND OF THE INVENTION

During the formation of semiconductor devices, such as dynamic random access memories (DRAMs), static random access memories (SRAMs), microprocessors, etc., insulating layers, such as silicon dioxide, phosphorous doped silicon dioxide, or other doped oxide, are used to electrically separate conductive layers, such as doped polycrystalline silicon, doped silicon, aluminum, refractory metal silicides, etc. It is often required that the conductive layers be interconnected through holes in the insulating layer. Such holes are commonly referred to as contact holes, i.e., when the hole extends through an insulating layer to an active device area, or vias, i.e., when the hole extends through an insulating layer between two conductive layers. The profile of a hole is of particular importance such that it exhibits specific characteristics when the contact hole or via is provided or filled with a conductive material. For example, many holes are high aspect ratio holes.

It is known to utilize plasmas containing fluorocarbons or hydrofluorocarbons to etch oxides relative to underlying silicon containing layers. For example, plasmas containing $CF_4$ have been used to perform such an etch. Using fluorocarbon or hydrofluorocarbon containing plasmas provides a means of selectively etching oxide films against an underlying silicon containing layer, i.e., the etching of the oxide film down to the underlying silicon layer without significantly etching the underlying silicon containing layer. In such a case, a high oxide to silicon etch rate ratio is required.

The mechanism responsible for fluorocarbons to accomplish high silicon dioxide to silicon etch rate selectivity involves the combination of at least two phenomena. First, the deposition of nonvolatile residue, e.g., a polymeric containing residue, is formed on various surfaces during the etching process, and second, the oxygen from the etching of the oxide in the process performs a particular role. While carbon containing residues are found to deposit on all surfaces inside an etch chamber containing fluorocarbon or hydrofluorocarbon plasmas, less accumulation is observed to occur on oxide surfaces, e.g., doped silicon dioxide, than on non-oxide surfaces, e.g., silicon containing surfaces such as silicon nitride, doped silicon, or polysilicon.

Carbon containing residues or polymeric residues deposit on surfaces in a hole (e.g., walls, bottom) when fluorocarbon discharges are present in several ways. One way involves the dissociation of fluorocarbon radicals upon being absorbed on a surface. Less residue accumulates on silicon dioxide surfaces because some of the carbon combines with the oxygen of the oxide being etched to form carbon monoxide or carbon dioxide, which are volatile. This in turn allows the silicon dioxide layer to continue to be etched under certain conditions when etching of other materials has ceased because of the formed nonvolatile residue. If a nonvolatile layer (e.g., carbon residue) deposits on a surface during etching, and it is not removed, etching will cease.

Further, with the use of a fluorocarbon or hydrofluorocarbon containing plasma, if the etching mechanism proceeds strictly by chemical action (e.g., the reaction of silicon with fluorine atoms generated by the plasma to form $SiF_4$), then only isotropic etching is accomplished which provides no advantage over wet etching of such silicon dioxide or oxides to form contact holes or vias. However, plasmas generated using fluorocarbons or hydrofluorocarbons allow for the ability to provide an anisotropic etch which is believed to depend in some way or another on the bombardment of the etched surface with energetic ions.

For example, in a typical silicon dioxide etching process, to provide a contact hole or via on a wafer, incident energetic particles generally arrive in a direction perpendicular to the wafer surface, hence they strike the bottom surfaces of the etched features. In processes, such as those using fluorocarbon or hydrofluorocarbon containing plasmas in which polymer deposition on the side wall and the bottom surface of the contact hole or via being etched occur simultaneously with the etching of the oxide, (i.e., nonvolatile polymer layers (also commonly referred to as surface inhibiting or blocking layers) that deposit on the surfaces being etched), surfaces not struck by the ions do not have the blocking layer removed and hence are protected against etching by the reactive gas. As such, etching is performed in a direction perpendicular to the wafer surface more quickly than etching of the side walls.

However, an "etch stop" phenomenon with respect to high aspect ratio features, such as contact holes and vias, is problematic. For example, as shown in FIG. 1, a substrate assembly 12 has an oxide layer 14 formed thereon. The oxide layer 14 is patterned using a mask layer 16 which defines the contact hole or via 18 through the oxide layer 14. With the mask layer 16 patterned, the contact hole or via 18 is etched using a fluorocarbon or hydrofluorocarbon plasma 22. As shown in FIG. 1, during the etching of the contact hole or via 18 with species (including ions 23) extracted from plasma 22, a nonvolatile polymeric residual layer 20 is formed on the side walls 19 and bottom surface 21 of the contact hole or via 18 due to carbon containing neutral species 24 resulting from the etch process. Such deposition of the polymeric residual layer 20 and etching of the oxide layer 14 occur simultaneously. When high aspect ratio features are etched, the etch rate and etch chemistry varies with the aspect ratio (or depth) of the feature. Often in contact hole or via etching the process starts out etching normally but at a certain aspect ratio the etching action undesirably stops, i.e., etch stop phenomena.

Therefore, a major problem in etching high aspect ratio contact holes and vias in oxides is that the etch chemistry changes with changing aspect ratio of the etched hole resulting in premature etch stop. This effect is most severe in the oxide contact hole and via etch processes because of the need to use a chemistry in which the etching of the oxide and the deposition of a polymeric residual material are taking place simultaneously. Because of the polymer deposition, the etch process may stop spontaneously well before the desired oxide is etched completely through, i.e., etch stop.

It should be recognized that rare gases are often mixed with feed gases in etch processes. Argon and helium are the most commonly used rare gases. Such use of rare gases is typically to dilute the chemical species and to stabilize the plasma being generated. In particular, various articles have discussed silicon dioxide contact etching with rare gases added to fluorocarbon feed gases. However, such rare gas additions have been limited to argon and helium in the etching of contact holes and vias. Further, the most common reasons for rare gas additions to a plasma are to improve the behavior of the plasma glow discharge. For example, electronegative gases, such as chlorine, $SF_6$, etc., form negative ions which reduce the electron concentration and causes the discharge to be unstable for which rare gases provide benefit. Further, for example, sometimes discharge ignition can be made much easier with rare gas additions. If the reactive gas prefers to be in liquid form (e.g., $Br_2$), rare gases are also sometimes used as carrier gases to carry the reactive gas to the plasma generation chamber. Rare gases, usually argon, have also been frequently injected at the 1–5% level as standards for an optical emission spectroscopy calibration process known as actinometry.

The present invention addresses the problems as indicated above, in particular, the etch stop phenomena in the etching of contact holes or vias in oxides. However, other advantages will become apparent to those skilled in the art from the following Detailed Description read in conjunction with the appended claims and the attached Figures.

SUMMARY OF THE INVENTION

An etching method for use in the fabrication of integrated circuits according to the present invention includes providing a substrate assembly having a surface and providing an oxide layer over the substrate assembly. A patterned mask layer is provided over the oxide layer exposing a portion of the oxide layer. A plasma is generated using one or more carbon and fluorine containing gases and a low ionization potential gas. The low ionization potential gas is selected from one of xenon and krypton. The oxide layer is then etched at the exposed portion to define an opening in the oxide layer while simultaneously depositing a polymeric residue on at least a sidewall of the opening being defined. The etching step is continued using the plasma generated until the opening in the oxide layer is etched selectively to the surface.

In another embodiment of an etching method according to the present invention for forming a contact opening, the method includes providing a substrate assembly having a silicon containing surface and an oxide layer thereon. A patterned mask layer is provided over the oxide layer exposing a portion of the oxide layer. A plasma including one or more of $C_xH_yF_z^+$ ions and $C_xF_z^+$ ions and further including $Xe^+$ ions is used to etch the oxide layer at the exposed portion to define the contact opening in the oxide layer while simultaneously depositing a polymeric residue on a surface defining the contact opening. The etching is continued until the contact opening in the oxide layer is selectively etched to the silicon containing surface.

In yet another method according to the present invention, a method for selectively etching silicon dioxide against a silicon containing layer is described. The method includes placing a substrate assembly into an etch zone. The substrate assembly includes a silicon containing surface with a silicon dioxide layer formed on the silicon containing surface. A patterned mask layer is formed over the silicon containing surface exposing a portion of the silicon dioxide layer. A plasma is generated in the etch zone. The plasma includes one or more of $C_xH_yF_z^+$ ions and $C_xF_z^+$ ions and further includes ions of a low ionization potential gas selected from xenon and krypton. The plasma selectively etches the silicon dioxide layer at the exposed portion to define an opening in the silicon dioxide layer while simultaneously depositing a polymeric residue on at least one surface defining the opening. Further, the plasma etches the silicon dioxide layer until the opening in the silicon dioxide layer is completely etched to the silicon containing surface.

The above methods are particularly advantageous for etching small high aspect ratio openings.

DETAILED DESCRIPTION OF THE EMBODIMENTS

The present invention shall be generally described with reference to FIGS. 1–5. In this application, "semiconductor substrate" refers to the base semiconductor layer, e.g., the lowest layer of silicon material in a wafer or a silicon layer deposited on another material, such as silicon on sapphire. The term "semiconductor substrate assembly" refers to a semiconductor substrate or a semiconductor substrate having one or more layers or structures formed thereon. When reference is made to a substrate assembly in the following description, various process steps may have been previously utilized to form regions/junctions in the semiconductor substrate thereof, e.g., doped areas. It should be apparent that the scaling on the figures does not represent precise dimensions of the various elements illustrated therein.

Figure 1:
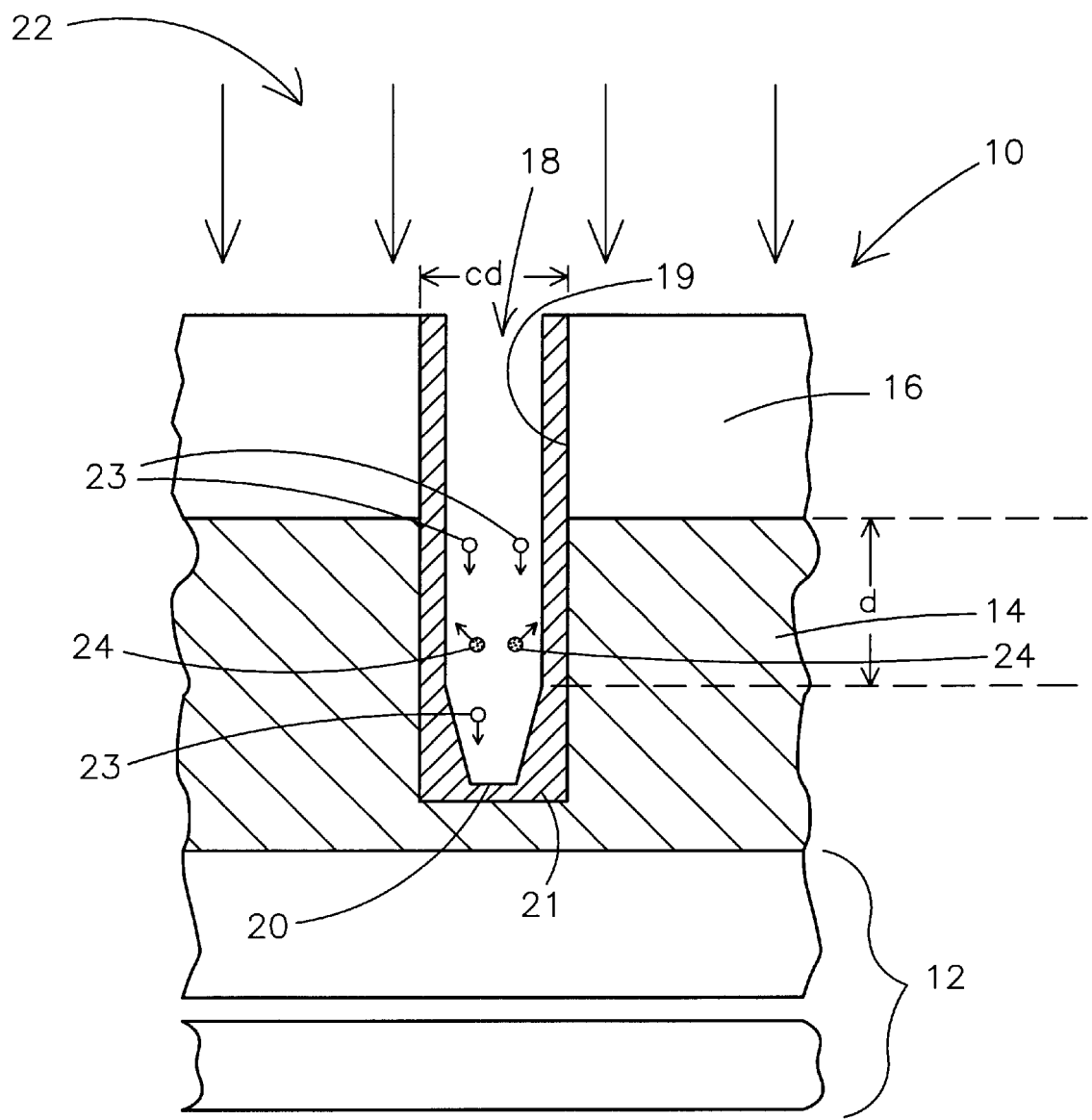
FIG. 1 is a cross-section illustration of a structure illustrating etch stop phenomenon.

FIG. 1 is an illustrative diagram of a structure illustrating the etch stop phenomenon as described in the Background of the Invention section and as further described below. The etch stop phenomenon with respect to high aspect ratio features, such as contact holes and vias, is problematic. As shown in FIG. 1, a substrate assembly 12 has an oxide layer 14 formed thereon. The oxide layer 14 is patterned using a mask layer 16 which defines the contact hole or via 18 through the oxide layer 14. With the mask layer 16 patterned, the contact hole or via 18 is etched using a fluorocarbon or hydrofluorocarbon plasma 22. As shown in FIG. 1, during the etching of the contact hole or via 18, a nonvolatile polymeric residual layer 20 is formed on the side walls 19 and bottom surface 21 of the contact hole or via 18 being defined.

The contact hole or via etch process, where high aspect ratio openings are etched through doped or undoped silicon dioxide down to a silicon containing layer, such as a doped silicon or silicon nitride layer, is a challenging plasma etching process. First, to obtain the required selectivity of silicon dioxide to the underlying silicon containing layer, a fluorocarbon or hydrofluorocarbon based plasma is necessary which leads to the formation of a polymeric residue layer on the side walls and bottom surface of the feature being defined. Such deposition of the polymeric residual layer 20 and the etching of the silicon dioxide occurs simultaneously. Further, when very small diameter high aspect ratio features are etched, the etch rate and etch chemistry vary with the aspect ratio (or depth) of the feature. Finally, high density plasma etching reactors are used for this process and the combination of high density plasmas, in which large ion currents are generated along with the deposition chemistries, leads to severe wall reactions which affect the entire process.

The dependence of the etch chemistry on the aspect ratio or depth of the feature being etched is very problematic. Even when using a "clean" nondeposition chemistry, such as etching silicon in chlorine containing plasmas, aspect ratio dependent etching is very poorly understood. Some have attributed aspect ratio dependent etching to an aspect ratio dependent ion flux caused by an incident ion flux which has a significant angular distribution (instead of all ions arriving at normal incidence) or by deflection of the ion flux resulting from electrostatic charging of insulating surfaces within the feature. Others attribute the aspect ratio dependent etching to a conductance limited flux of neutral species at the bottom surface of the feature.

However, other phenomenon with respect to aspect ratio dependent etching are apparent. For example, the phenomenon referred to hereinafter as "geometric trapping" of incident ions by a high aspect ratio feature is apparent. For example, with use of a fluorocarbon or hydrofluorocarbon based plasma, the ionic species consist, to a large extent, of species having the form of $C_xH_yF_z^+$ or $C_xF_z^+$ where, in high density plasmas, x, y, and z are rarely larger than 1 or 2, and x is most often equal to 1. If one assumes that x is 1, then a simple calculation reveals that large deposition rates are possible with the ion currents incident on surfaces and high density plasmas if all the ions condensed on the surface. The expression relating deposition rate of a polymeric residual material to an incident ion flux where all the ions contain one carbon atom and all the ions condense on the surface is: deposition rate (nm/min)=113.6 x ion current density (ma/cm$^2$). That is, the deposition that could result from 10 ma/cm$^2$ of carbon containing ions exceeds 1 $\mu$m/minute.

Such large deposition rates are not observed, at least in part, indicating that a small fraction (20–30%) of the ions condense on the surface. In order to remain on the surface, the ion must dissipate its kinetic energy upon collision with the surface, and this may not occur if the ion energy is too low for it to penetrate into the lattice of the solid. If the ion collides with the flat surface and does not transfer all its kinetic energy during collision, the ion will be reflected from the surface back into the plasma (most likely dissociated into neutral fragments) and is gone. However, if the ion collides with the bottom surface of a high aspect ratio feature and is reflected back as neutral fragments (with much less energy than the incident ion), it is still present because the dissociated fragments will undergo collisions with the side walls of the feature eventually condensing to form a polymeric residual film at some location in the high aspect ratio feature. That is, the sticking probability of the ion has been effectively increased by the "trapping" action of the high aspect ratio feature.

Often in contact hole or via etching the process starts out etching normally but at a certain aspect ratio the etching action stops, as described in the Background of the Invention section herein. This occurs even though there is oxide material remaining to be etched. The geometric trapping, as described above, of the ionic species appears to be at least partially responsible for this etch stop behavior as well as the observation that the selectivities to silicon or silicon nitride often increase with increasing aspect ratio. It is noted that the ionic species are preferentially influenced by these geometric trappings because of the fact that the energy and nature of the incident particle are changed by the collision. For example, the incident ion might be a 100 eV $CHF_2^+$ ion which might have a low sticking probability, but the reflected species might consist of a 4 eV CF radical and a 3 eV HF molecule (energies and species selected at random). The CF radical, a condensable species, will almost certainly deposit somewhere in the small feature whereas the unreactive HF molecule might survive the numerous wall collisions required to escape from the small high aspect ratio feature. A neutral F atom, an uncondensable entity with a small reaction probability on fluorinated surfaces, might be able to enter a small feature and not react during the numerous wall collisions it would undergo.

Thus, it seems that a reason polymerization suddenly dominates over etching in a high aspect ratio feature is the trapping of ionic species (or more correctly, the fragments of the ion solid collision) in the small feature increasing the effective sticking probability of the ions, most of which contain one or more condensable carbon atoms. The present invention utilizes a low ionization potential gas, such as xenon or krypton, to reduce this effect. For example, xenon (Xe), which has an ionization potential of 12 eV, is the most easily ionized of all the rare gases, except radioactive radon. Many of the species present in fluorocarbon or hydrofluorocarbon plasmas have significantly higher ionization potentials. Plasmas, because of the exponentially decreasing number of high energy electrons, tend to ionize low ionization potential species much more readily than the fluorocarbon or hydrofluorocarbon species. Therefore, the ion current emanating from a $C_xH_yF_z$/Xe or $C_xF_z$/Xe containing plasma has a disproportionately large fraction of Xe$^+$ ions relative to the $C_xH_yF_z^{30}$ and/or $C_xF_z^+$ species. These Xe$^+$ ions assist in the etching process but do not contribute to the deposition process of the polymeric residual material, thereby eliminating or reducing the tendency of polymerization to overtake the etching as the etched depth increases, reducing effects of etch stop.

Figure 2:
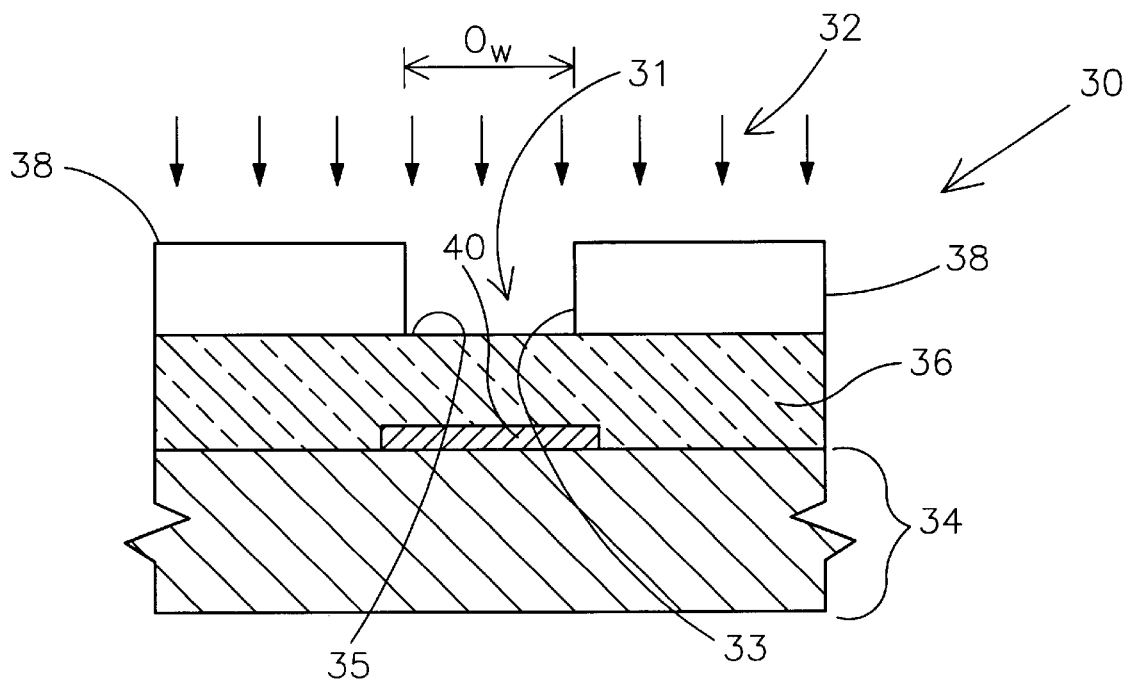
FIG. 2 is a cross-section illustration of an etch process in accordance with the present invention.
Figure 3:
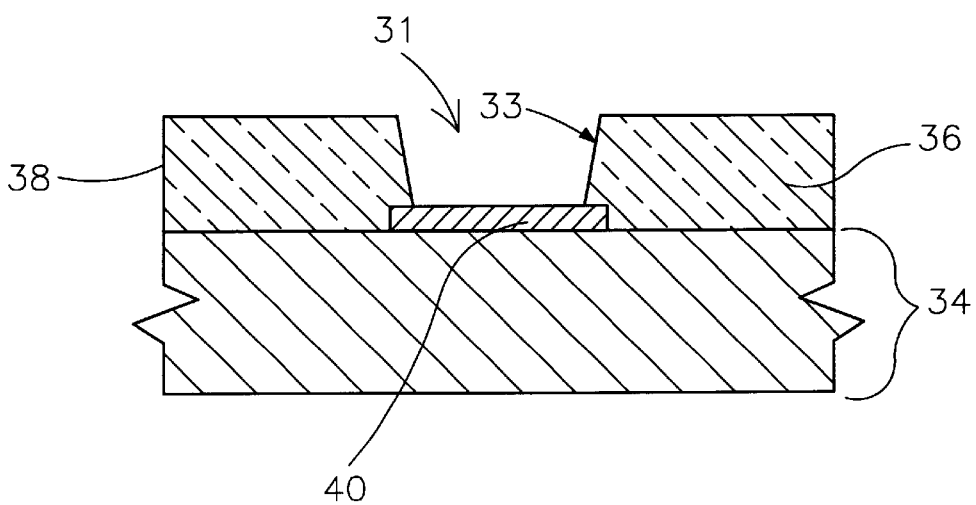
FIG. 3 is a cross-section illustration of a resulting structure after performance of the etch method in accordance with the present invention.

FIG. 2 shows a structure 30 to be etched using a plasma 32 generated in accordance with the present invention. The structure 30 includes substrate assembly 34 having an oxide layer 36 formed thereon. The structure 30 further includes a patterned mask layer 38. It should be apparent to one skilled in the art that the structure may be used in formation of various devices or circuits, such as SRAMs, DRAMs, etc.

The present invention is beneficial for defining high aspect ratio openings, e.g., contact holes or vias, through an oxide insulating layer to any underlying material. As such, substrate assembly 34 includes a surface region 40 to which the high aspect ratio opening 31 extends. Thus, the opening 31 provides for forming an interconnect, an electrode, etc., relative to the surface region 40 of substrate assembly 34. For example, the surface region 40 may be any silicon containing region, e.g., a silicon nitride region or a doped silicon or doped polysilicon region. However, the present invention is in no manner limited to such silicon containing regions but is limited only in accordance with the accompanying claims. Preferably, however, the present invention is particularly beneficial to obtain a high etch selectivity of silicon dioxide over a silicon containing region, such as silicon nitride, titanium silicide, doped silicon, or polysilicon, so as to reduce etch stop effects from occurring in high aspect ratio features. However, such high aspect ratio features may be formed relative to any surface region 40 (e.g., silicon nitride, a metal interconnect, a metal silicide, dielectric material) of a substrate assembly 34 for forming any number of features, such as a contact hole for an interconnect level, a gate electrode, a capacitor electrode, a via, etc. It should be recognized that the surface region 40 may be the same or different from the material of the remainder of substrate assembly 34. For example, the surface region 40 may be of a continuous nature with the remainder of the substrate assembly 34.

The oxide layer 36 formed over the substrate assembly 34 including surface region 40 may be any known oxide utilized in the fabrication of integrated circuits. Preferably, the oxide layer 36 is doped or undoped silicon dioxide. For example, such silicon dioxide may be doped (e.g., with boron, phosphorous, etc.), or the oxide layer may be doped or undoped tetraethylorthosilicate (TEOS).

A patterned etch resistant material 38, i.e., mask layer, is formed over the oxide layer 36 exposing a portion of the oxide layer 36 defining opening 31. The etch resistant mask layer 38 may be, for example, photoresist or any other mask layer. The patterning of the photoresist or mask layer is performed in a conventional manner as is readily known to one skilled in the art. The oxide layer 36 is exposed at a portion directly over the surface region 40 of substrate assembly 34 to which the oxide layer 36 is to be opened. With the substrate assembly 34, the oxide layer 36 and the patterned mask layer 38 provided, an etch of the exposed portion of oxide layer 36 is performed.

The thickness of the oxide layer 36 or the depth of the opening 31 to be defined is preferably of a dimension suitable for definition of small high aspect ratio features. Small high aspect ratio features are defined herein as features having aspect ratios (i.e., the height to spacing ratio of two adjacent steps of a substrate assembly such as steps which define an opening, a trench, etc.) greater than about 1 and features sizes or critical dimensions of below about 1 micron (e.g., such as opening width $O_w$ being less than about 1 micron). Although the present invention is particularly beneficial for definition of small high aspect ratio features, the present invention may also be beneficial for the definition of other sized openings. Further, openings other than contact holes and vias, e.g., such as trenches, are also contemplated in accordance with the present invention.

The etch of the oxide layer 36 is an anisotropic etch performed using a plasma 32 generated in accordance with the present invention. The plasma 32 generated in accordance with the present invention is generated utilizing a reactive gas component, i.e., a gas component reactive with the oxide layer 36 and a low ionization potential gas.

The plasma may be generated utilizing any known suitable etching device, such as an etcher available from Applied Materials under the trade designation of P5000 etcher, an etching apparatus as described in U.S. Pat. No. 4,298,443; a 9100 TCP Oxide Etcher available from Lam Research Corporation, or any other high density plasma etcher. It should be readily apparent to one skilled in the art that depending upon the particular etching apparatus utilized to generate the plasma, various parameters provided herein may vary for accomplishing similar objectives.

Preferably, the plasma 32 is generated using one or more fluorocarbon or hydrofluorocarbon gases such as $CF_4$, $CHF_3$, $C_2F_6$, $C_3F_8$, $CH_2F_2$, $C_2HF_5$, or any other carbon and fluorine containing gases alone or in combination with other gases (e.g., $CF_4$ in combination with $H_2$) which, when utilized to generate a plasma, dissociate resulting in fragments for use in an oxide etching process. In other words, any fluorocarbon or hydrofluorocarbon feed gases for use in generating $C_xH_yF_z^+$ ions or $C_xF_z^+$ ions may be utilized in accordance with the present invention. It will be recognized by one skilled in the art that other gases such as $H_2$ or $O_2$ may be utilized with the gases used herein to adjust the nature of the carbon and fluorine containing ions.

Preferably, the low ionization potential gas is selected from gases having ionization potentials significantly lower than the fluorocarbon or hydrofluorocarbon gas used in generating the plasma. More preferably, the present invention uses xenon or krypton for generation of the plasma 32. Yet further, more preferably, xenon, having an ionization potential of 12 eV, which is the most easily ionized of all rare gases except radioactive radon, is used in accordance with the present invention.

Figure 4:
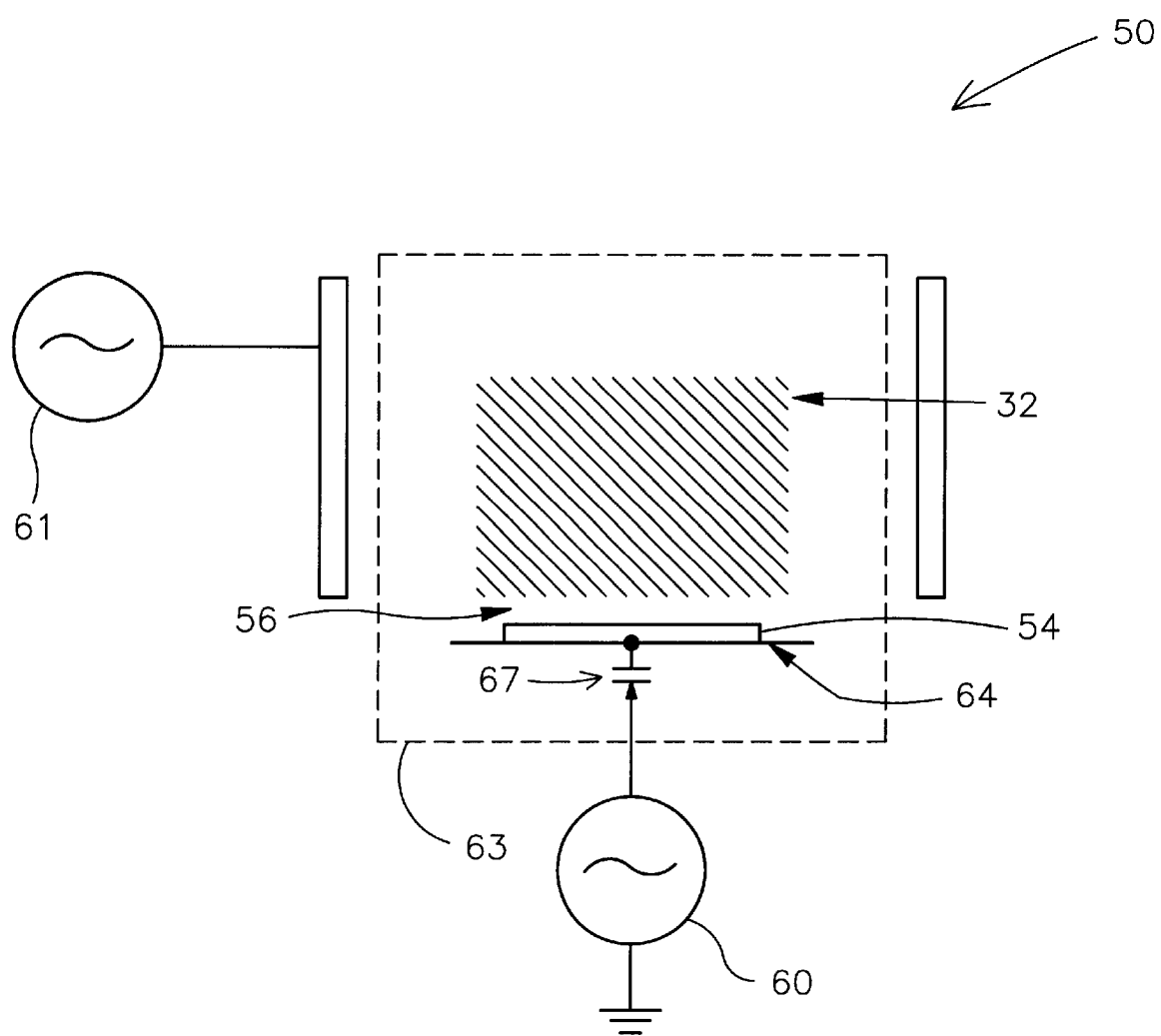
FIG. 4 is a general illustrative diagram of a plasma generation device for use in accordance with the present invention.

FIG. 4 generally shows an illustrative plasma generation apparatus 50 for performing etching in accordance with the present invention. It should be recognized that this is an illustrative diagram representative of an entire system even though only several components of the system are shown. Various systems incorporating many elements in various configurations may be utilized in accordance with the present invention. To generate plasma 32, one or more carbon and fluorine containing gases along with a low ionization potential gas are provided to the illustrative plasma generator 50. Preferably, the low ionization potential gas is provided to the plasma generation apparatus 50 with the one or more carbon and fluorine containing feed gases at a percentage of less than about 29% of the total flow rate of the low ionization potential gas and the one or more fluorine and carbon containing gases. More preferably, the percentage of the low ionization potential gas is less than about 20% of the flow of the low ionization potential gas and the one or more fluorine and carbon containing gases.

The illustrative plasma generating apparatus 50 includes a powered electrode 64 connected to an RF bias source 60 via capacitance 67 upon which a wafer is placed. Further, an RF source 61 is connected to elements, e.g., coils, for generating the high density plasma 32 in chamber 63. Ion sheath 56 is formed between the high density plasma 32 and the powered electrode 64. With the wafer 54 (including the structure as shown in FIG. 2) positioned within the illustrative plasma generation apparatus 50, the oxide layer 36 is etched in accordance with the present invention resulting in the structure of FIG. 3 after removal of patterned mask layer 38. The power source 61 utilized may be any suitable power source including an RF generator, a microwave generator, etc. It will be readily apparent that any high density plasma etching system may be used according to the present invention. As used herein, preferably a high density plasma is a plasma generated having at least $5 \times 10^9$ ions per cubic centimeter. Further, in accordance with the present invention, the high density plasma system is preferably operated at a low pressure of less than about 30 mTorr; more preferably less than about 5 mTorr.

Generally, with use of the plasma 32 generated in accordance with the above description, the problem of having polymerization suddenly dominate over etching of the high aspect ratio features (e.g., opening 31) is reduced. This result is particularly due to the addition of xenon gas to the plasma 32. As described above, generally fluorocarbons or hydrofluorocarbons have significantly higher ionization potentials than the ionization potential of xenon. Plasmas, because of the exponentially decreasing number of high energy electrons, tend to ionize low ionization potential species much more readily. Therefore, the ion current emanating from the $C_xH_yF_z$/Xe plasma or the $C_xF_z$/Xe plasma will have a larger fraction of $Xe^+$ ions relative to fluorocarbon or hydrofluorocarbon ions. These $Xe^+$ ions assist in the etching process but do not contribute to the deposition process of forming a polymeric residual material on the bottom surface of the opening being defined. Thus, the addition of the low ionization potential gas to the plasma eliminates or reduces the tendency of polymerization to overtake the etching as the etch depth of a high aspect ratio feature increases. In other words, the oxide layer 36 is etched using the plasma 32. Simultaneously, as the oxide layer is being etched, the etching results in a polymeric residue material being deposited at the bottom 35 of the opening being defined and side walls 33 of the opening 31 being defined. As the etching step continues, with use of a plasma created using the fluorine and carbon containing gas and the low ionization potential gas, the hole in the oxide layer is completely etched selectively to the underlying silicon containing region 40 of substrate assembly 34. The etch stop phenomenon effects which are, undesirable in the fabrication of opening 31, are therefore reduced and potentially eliminated resulting in the structure shown in FIG. 3 with the patterned mask layer 38 removed.

In addition to the larger fraction of $Xe^+$ ions in the plasma, a second benefit is also apparent. This additional benefit arises from the fact that $Xe^+$ has a large mass relative to other ions in the plasma. In high density plasmas, which have very thin sheaths 56 as shown in FIG. 4, ions can traverse the sheath in a time shorter than or comparable to the period of the RF bias. This means that the energy of the ion is dependent on the phase of the RF bias when the ion enters the sheath. This effect leads to some ions having lower energies which are more easily affected by electrostatic charging within the high aspect ratio feature. Ions with high mass take longer to traverse the sheath and therefore are approximately monoenergetic, i.e., all the ions have approximately the same energy. $Xe^+$ ions, being of high mass, are therefore more monoenergetic and less subject to deflection caused by electrostatic charging.

EXAMPLE 1

Figure 5A:
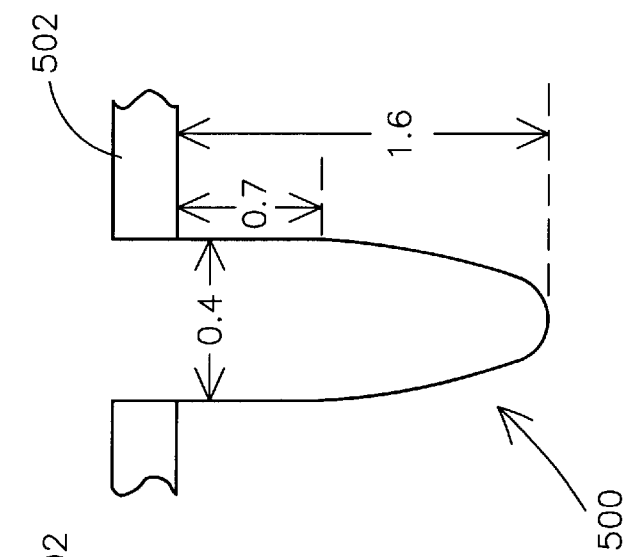
FIGS. 5A–5C are illustrations of features etched corresponding to the Examples.

A 0.4 critical dimension feature (cd as shown in FIG. 1 and FIG. 5A) was etched in a silicon dioxide layer 300 having patterned photoresist 302 thereon using a Lam 9100 TCP Oxide Etcher. The conditions of the Etcher included:

| | |
|---|---|
| TCP Power | 1000 Watts |
| Bias Power | 1375 Watts |
| Flows into the Etcher | 35 sccm of $CHF_3$ |
| | 45 sccm of $C_2HF_5$ |
| | 20 sccm of $CH_2F_2$ |
| Etch Time | 90 seconds |
| Pressure | 2.25 mtorr |

The feature was vertically etched to a depth (d as shown in FIG. 1 and FIG. 5A) of about 0.3 microns before the cd abruptly changed with the lower portion of the etch having a cd of about 0.2 microns to an etch depth of about 1.1 microns. This is illustrative of etch stop.

EXAMPLE 2

Figure 5B:
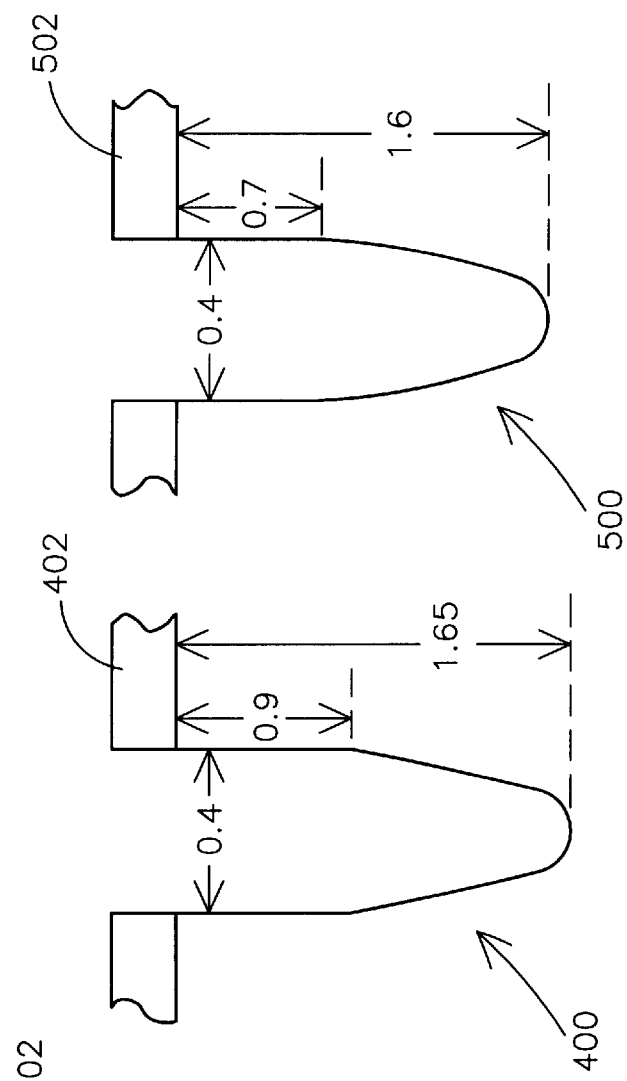

A 0.4 critical dimension feature as shown in FIG. 5B was etched in a silicon dioxide layer 400 having a patterned photoresist 402 thereon using a Lam 9100 TCP Oxide Etcher under the same conditions as in Example 1 except with a flow into the Etcher of 25 sccm of Xenon and a pressure of 2.64 mtorr. The feature was successfully vertically etched to a depth of about 0.9 microns with a gradual smooth taper thereafter to a depth of about 1.65 microns.

EXAMPLE 3

Figure 5C:
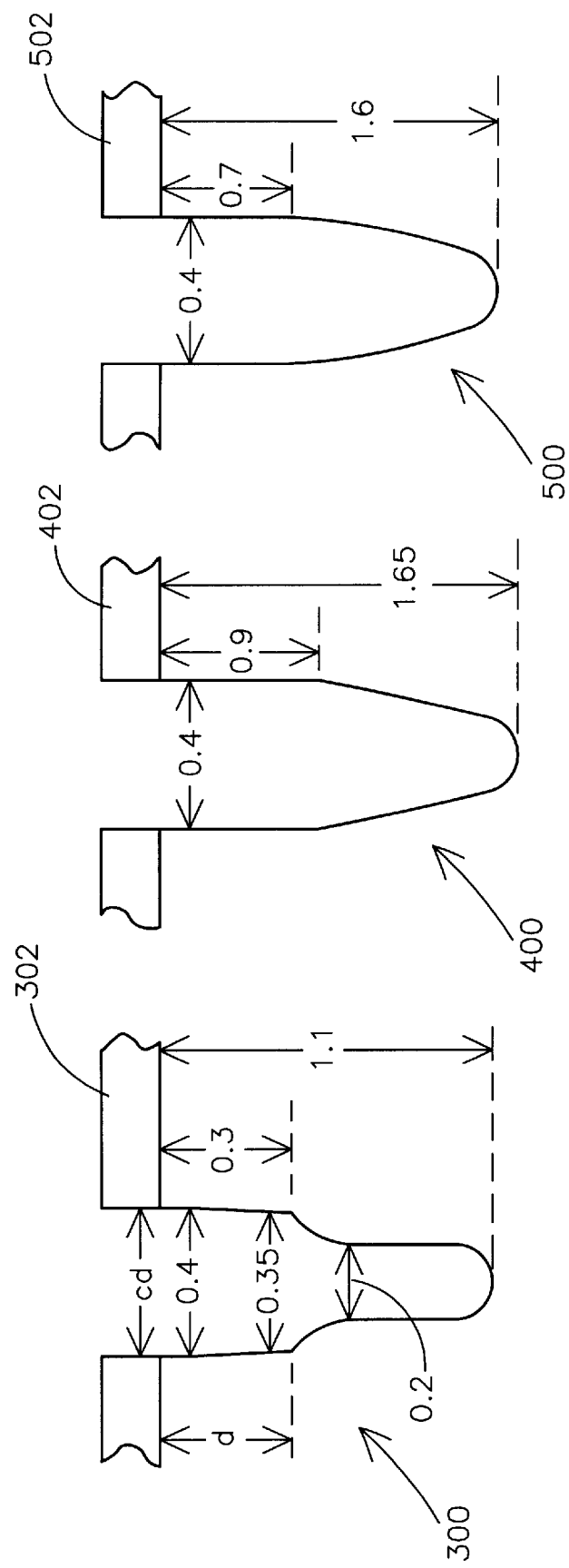

A 0.4 critical dimension feature as shown in FIG. 5C was etched in a silicon dioxide layer 500 having a patterned photoresist 502 thereon using a Lam 9100 TCP Oxide Etcher under the same conditions as in Example 1 except with a flow into the Etcher of 50 sccm of Xenon and a pressure of 3.0 mtorr. The feature was vertically etched to a depth of about 0.7 microns before the etch profile tapered gradually to a depth of about 1.6 microns.

From such Examples it is shown that the etch of small features is affected by the Xenon content in the plasma and that a certain amount of Xenon in the plasma stops the abrupt transition/failure of the etch profile, i.e, etch stop, as shown by the comparison of FIGS. 5A and 5B. Such Examples also appear show that addition of too large an amount of Xenon in the plasma may lead to worse results than lesser amounts of Xenon (compare FIGS. 5B and 5C).

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the scope of the present invention.

What is claimed is:

1. An etching method for use in the fabrication of integrated circuits, the method comprising:

providing an oxide material comprising at least one exposed oxide region and at least one non-exposed oxide region;

providing at least one reactive gas component, wherein the at least one reactive gas component comprises at least carbon and flourine;

providing a low ionization potential gas, wherein the low ionization potential gas comprises at least one of xenon and krypton; and etching the at least one exposed oxide region with a plasma generated using the at least one reactive gas component and the low ionization potential gas to define an opening in the oxide material and to deposit a polymeric residue on at least a sidewall of the opening being defined.

2. The method of claim 1, wherein providing the at least one exposed oxide region comprises:

providing a substrate assembly having a surface;

providing the oxide material on the substrate assembly surface; and providing a patterned mask layer over the oxide material.

3. The method of claim 2, wherein the surface is a silicon containing surface.

4. The method of claim 3, wherein the silicon containing surface is one of silicon, polysilicon, or silicon nitride.

5. The method of claim 1, wherein etching the at least one exposed oxide region comprises defining the opening and simultaneously depositing the polymeric residue on the at least a sidewall of the opening being defined.

6. The method of claim 1, wherein the low ionization potential gas is xenon.

7. The method of claim 1, wherein providing the low ionization potential gas includes providing a flow of xenon that is less than about 29 percent of the flow of xenon and a flow of the at least one reactive gas component.

8. The method of claim 7, wherein the flow of xenon is less than about 20 percent of the flow of xenon and the flow of the at least one reactive gas component.

9. The method of claim 1, wherein the opening is a small high aspect ratio opening having a critical dimension of less than about 1 micron and an aspect ratio greater than about 1.

10. The method of claim 1, wherein the opening is a via.

11. The method of claim 1, wherein the opening is a contact hole.

12. An etching method for forming a contact opening, the method comprising:

providing an oxide material comprising at least one exposed oxide region and at least one non-exposed oxide region;

providing a plasma, wherein the plasma comprises low ionization potential gas ions and reactive gas ions, wherein the low ionization potential gas ions comprise at least one of xenon ions and krypton ions, wherein the reactive gas ions comprise at least ions from a group consisting of ions comprising carbon, hydrogen, and flourine, and ions comprising carbon and fluorine; and etching the at least one exposed oxide region of the oxide material using the plasma to define the contact opening in the oxide material and to deposit a polymeric residue on a surface defining the contact opening.

13. The method of claim 12, wherein providing the at least one exposed oxide region comprises:

providing a substrate assembly having a surface;

providing the oxide material on the substrate assembly surface; and providing a patterned mask layer over the oxide material.

14. The method of claim 13, wherein etching the at least one exposed oxide region comprises defining the contact opening in the oxide material to the substrate assembly surface.

15. The method of claim 12, wherein etching the at least one exposed oxide region comprises defining the opening and simultaneously depositing the polymeric residue on the surface defining the contact opening.

16. The method of claim 12, wherein the low ionization potential gas ions comprise xenon ions.

17. The method of claim 12, wherein providing the plasma comprises providing a flow of at least one of fluorocarbon gases and hydrofluorocarbon gases and providing a flow of xenon to a processing chamber.

18. The method of claim 17, wherein the flow of xenon is less than about 29 percent of the flow of xenon and the flow of at least one of fluorocarbon gases and hydrofluorocarbon gases.

19. The method of claim 18, wherein the flow of xenon is less than about 20 percent of the flow of xenon and the flow of the at least one of fluorocarbon gases and hydrofluorocarbon gases.

20. The method of claim 12, wherein the contact opening has a critical dimension of less than about 1 micron and an aspect ratio of greater than about 1.

21. A method for selectively etching silicon dioxide against a silicon containing layer, the method comprising:

providing a substrate assembly in an etch zone, wherein the substrate assembly comprises a silicon containing surface, a silicon dioxide layer formed on the silicon containing surface, and a patterned mask layer formed to expose a portion of the silicon dioxide layer;

generating a plasma in the etch zone, wherein the plasma comprises low ionization potential gas ions and reactive gas ions, wherein the low ionization potential gas ions comprise at least one of xenon ions and krypton ions, wherein the reactive gas ions comprise at least ions from a group consisting of ions comprising carbon, hydrogen, and flourine, and ions comprising carbon and fluorine, and further wherein the plasma etches the silicon dioxide layer at the exposed portion to define an opening in the silicon dioxide layer to the silicon containing surface and deposits a polymeric residue on at least one surface defining the opening.

22. The method of claim 21, wherein etching the silicon dioxide layer comprises defining the opening and simultaneously depositing the polymeric residue on the at least one surface defining the opening.

23. The method of claim 21, wherein the low ionization potential gas ions comprise xenon ions.

24. The method of claim 21, wherein generating the plasma comprises providing a flow of at least one of fluorocarbon gases and hydrofluorocarbon gases and providing a flow of xenon to a processing chamber.

25. The method of claim 24, wherein the flow of xenon is less than about 29 percent of the flow of xenon and the flow of the at least one of fluorocarbon gases and hydrofluorocarbon gases.

26. The method of claim 25, wherein the flow of xenon is less than about 20 percent of the flow of xenon and the flow of the at least one of the fluorocarbon gases and hydrofluorocarbon gases.

27. An etching method for forming an opening, the method comprising:

providing an oxide material comprising at least one exposed oxide region and at least one non-exposed oxide region;

providing a plasma, wherein the plasma comprises at least $Xe^+$ ions and reactive gas ions, wherein the reactive gas ions comprise at least ions from a group consisting of ions comprising carbon, hydrogen, and flourine, and ions comprising carbon and fluorine, and further wherein the plasma comprises a larger fraction of $Xe^+$ ions relative to the reactive gas ions; and etching the at least one exposed oxide region.

28. The method of claim 27, wherein providing the at least one exposed oxide region comprises:

providing a substrate assembly having a surface;

providing the oxide material on the substrate assembly surface; and providing a patterned mask layer over the oxide material.

29. The method of claim 28, wherein the surface of the substrate assembly is a silicon containing surface.

30. The method of claim 29, wherein the silicon containing surface is one of silicon, polysilicon, and silicon nitride.

31. The method of claim 27, wherein providing the plasma comprises providing a flow of at least one of fluorocarbon gases and hydrofluorocarbon gases and providing a flow of xenon to a processing chamber.

32. The method of claim 31, wherein the flow of xenon is less than about 29 percent of the flow of xenon and the flow of the at least one of fluorocarbon gases and hydrofluorocarbon gases.

33. The method of claim 32, wherein the flow of xenon is less than about 20 percent of the flow of xenon and the flow of the at least one of fluorocarbon gases and hydrofluorocarbon gases.

34. The method of claim 27, wherein the opening has a critical dimension of less than about 1 micron and an aspect ratio of greater than about 1.

35. The method of claim 27, wherein etching the at least one exposed oxide region comprises defining an opening in the oxide material and depositing a polymeric residue on at least a sidewall of the opening being defined.

36. The method of claim 35, wherein etching the at least one exposed oxide region comprises defining the opening and simultaneously depositing the polymeric residue on the at least a sidewall of the opening being defined.

* * * * *